United States Patent [19]
Carapella et al.

[11] Patent Number: 6,153,829
[45] Date of Patent: Nov. 28, 2000

[54] SPLIT CAVITY WALL PLATING FOR AN INTEGRATED CIRCUIT PACKAGE

[75] Inventors: Elissa E. Carapella, Chandler; Mark J. Palmer, Phoenix, both of Ariz.

[73] Assignee: Intel Corporation, Santa Clara, Calif.

[21] Appl. No.: 09/153,630

[22] Filed: Sep. 15, 1998

[51] Int. Cl.[7] .................................. H02G 3/08; H05K 5/00
[52] U.S. Cl. .......................... 174/52.1; 257/675; 257/680; 257/708; 257/712; 361/761; 361/764; 361/777
[58] Field of Search .......................... 174/52.1; 257/712, 257/708, 675, 680; 361/761, 764, 777

[56] References Cited

U.S. PATENT DOCUMENTS

| | | | |
|---|---|---|---|
| 5,491,362 | 2/1996 | Hamzehdoost et al. | 257/712 |
| 5,557,502 | 9/1996 | Banerjee et al. | 361/712 |
| 5,877,553 | 3/1999 | Nakayama et al. | 257/708 |
| 6,008,532 | 12/1999 | Carichner | 257/691 |

*Primary Examiner*—William A. Cuchlinski, Jr.
*Assistant Examiner*—Ronnie Mancho
*Attorney, Agent, or Firm*—Blakely, Sokoloff, Taylor & Zafman LLP

[57] ABSTRACT

An electronic package that may include a first bond pad and a second bond pad located on a bond shelf. The bond shelf may have an edge. The package may have a first conductive bus that may be connected to the first bond pad by a first conductive strip that extends along the edge of the bond shelf. The package may also have a second conductive bus that may be connected to the second bond pad by a second conductive strip that extends along the edge of the bond shelf.

35 Claims, 3 Drawing Sheets

SPLIT CAVITY WALL PLATING FOR AN INTEGRATED CIRCUIT PACKAGE

BACKGROUND OF THE INVENTION

1. Field of the Invention

The present invention relates to an integrated circuit package.

2. Description of Related Art

Integrated circuits are typically housed within a package which has a plurality of external contacts that are soldered to a printed circuit board. The package may also have a number of internal bond pads that are connected to corresponding pads of the integrated circuit by bond wires or a tape automated bonding (TAB) tape. The internal bond pads may be connected to the external contacts by routing layers and busses within the package. The busses and routing layers have conductive planes and traces that are dedicated to the power/ground busses and digital signal lines of the integrated circuit, respectively. By way of example, a conventional package may have a first bus layer dedicated to power, one or more routing layers dedicated to digital signals and a second bus layer dedicated to ground.

The various conductive layers are spatially located within different planes in the package. The layers are typically interconnected by conductive vias formed within the package. The bond pads may also be connected to the internal conductive layers by vias. Vias are typically formed by creating a hole in the dielectric package material and then plating the hole with a conductive material such as copper. The plating process is a relatively time consuming and expensive step. For this reason it is desirable to create an integrated circuit package with a minimal number of vias.

Some integrated circuits require power at different voltage levels. For example, an integrated circuit may require both 3.3 V and 2.0 V power. The additional voltage level requires an additional conductive power plane within the package. The second power plane can be created by forming an additional conductive layer within the package. The additional conductive layer requires more vias to connect the second power plane to the bond pads. It would be desirable to provide a dual voltage integrated circuit package which minimized the number of vias required to interconnect the pads and conductive layers of the package.

U.S. Pat. No. 5,557,502, issued to Banerjee et al., discloses an integrated circuit package which has a conductive strip that wraps around an edge of a bond shelf to interconnect a power bus to one or more bond pads on the shelf. The conductive strip is typically formed by initially masking all surfaces of the integrated circuit package except for the edge, and then dipping the package into a plating bath of copper. The plating bath plates copper onto the edge on the bond shelf.

The conductive copper strip extends continuously along the entire edge of the bond shelf. Because of this only one voltage level can be supplied to the contact pads located on the bond shelf with the plated edge. To provide more design flexibility it would be desirable to connect multiple power/ground planes to the bond pads on the bond shelf with the conductive strip.

SUMMARY OF THE INVENTION

The present invention is an electronic package that may include a first bond pad and a second bond pad located on a bond shelf. The bond shelf may have an edge. The package may have a first conductive bus that may be connected to the first bond pad by a first conductive strip that extends along the edge of the bond shelf. The package may also have a second conductive bus that may be connected to the second bond pad by a second conductive strip that extends along the edge of the bond shelf.

DETAILED DESCRIPTION OF THE INVENTION

Figure 1:
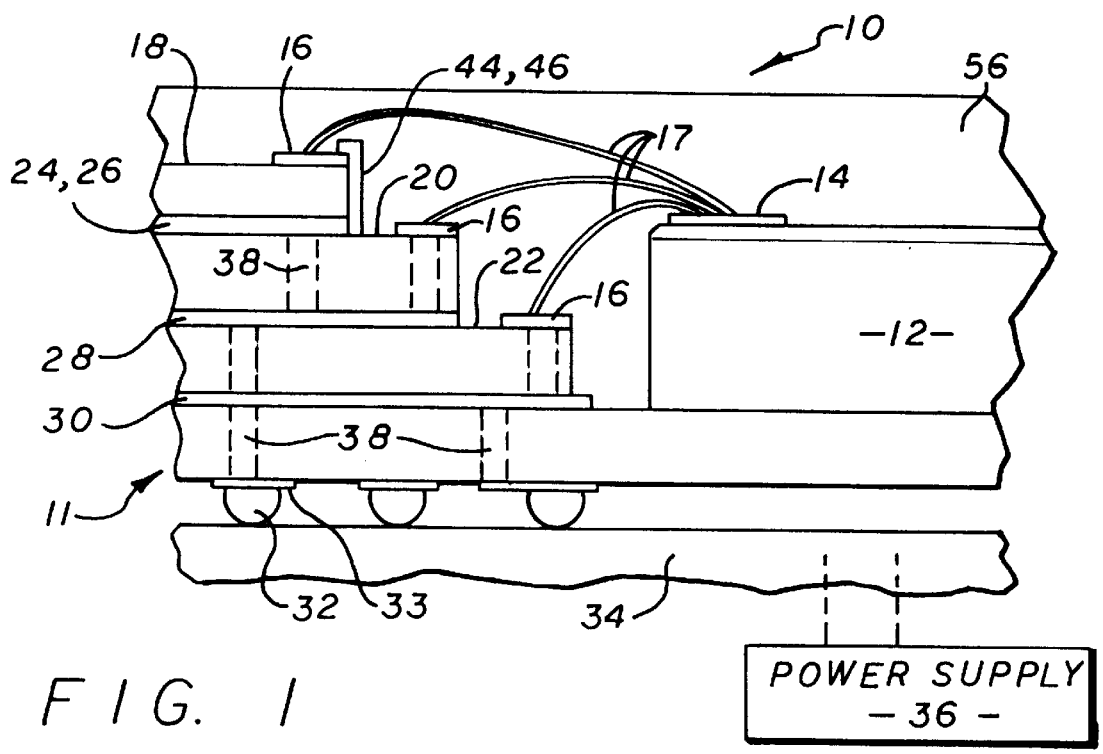
FIG. 1 is a cross-sectional view of an integrated circuit package of the present invention.
Figure 2:
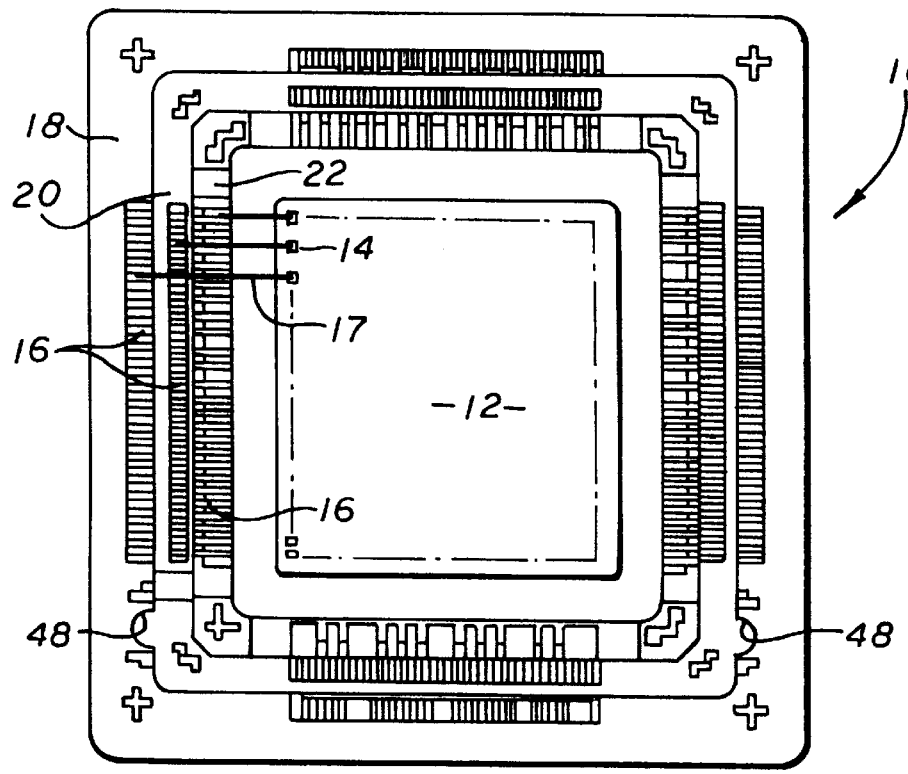
FIG. 2 is a top sectional view of the package.
Figure 3:
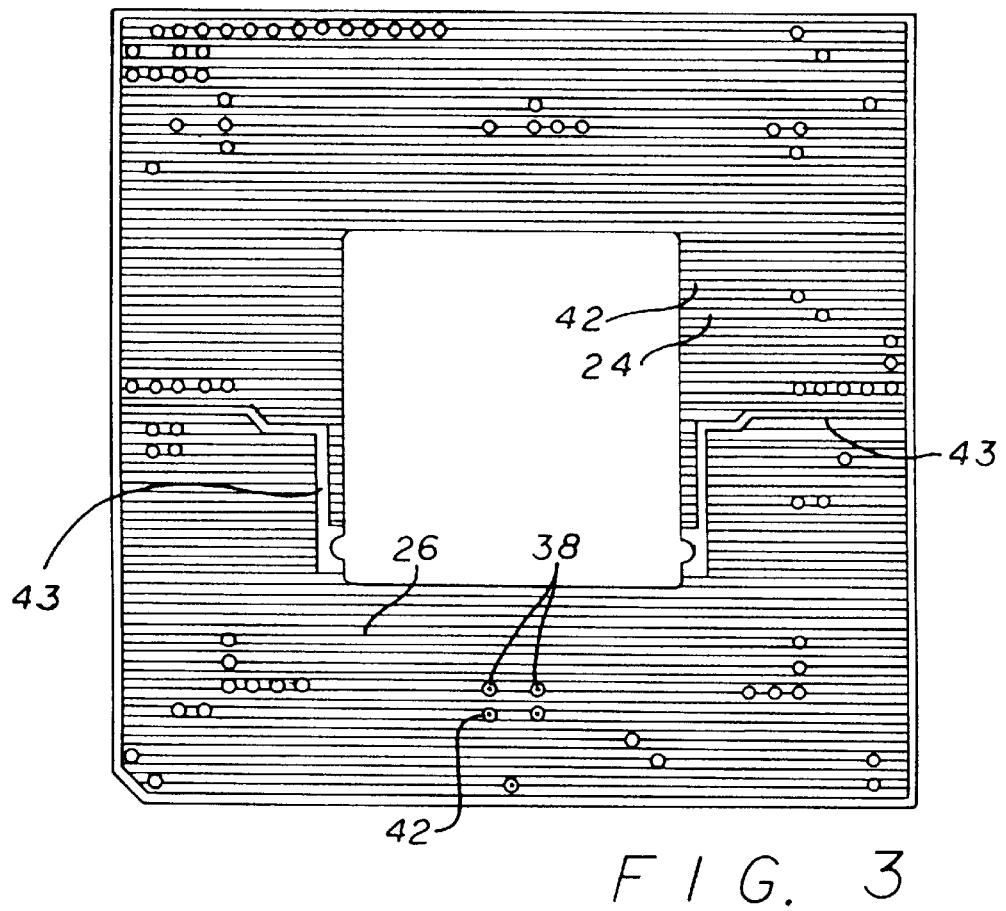
FIG. 3 is a top cross-sectional view of the integrated circuit package showing a pair of power busses within the same plane of the package.

Referring to the drawings more particularly by reference numbers, FIGS. 1–3 show an integrated circuit package 10 of the present invention. Mounted to the package 10 is an integrated circuit 12. Although an integrated circuit 12 is shown and described, it is to be understood that the package 10 may house any passive or active electrical device. The integrated circuit 12 has a plurality of bond pads 14 that are connected to corresponding bond pads 16 of a package housing 11. The bond pads 14 and 16 may be connected by bond wires 17 or a tape automated bonding (TAB) tape (not shown). The bond pads 16 may be located on a first bond shelf 18, a second bond shelf 20 and a third bond shelf 22. Although three bond shelves are shown and described, it is to be understood that the package 10 may have any number of bond shelves.

The bond pads 16 of the first bond shelf 18 are connected to a pair of power busses 24 and 26 within the package. The busses 24 and 26 are separated and located within the same horizontal plane of the package. By locating both power busses 24 and 26 within the same plane the present invention provides a package that may require less layers than a package that has two power busses located within different layers of the package.

The package 10 may also have one or more layers of routing traces 28 and a ground bus 30 dedicated to the digital signal lines and ground of the integrated circuit 12, respectively. The busses 24, 26 and 30, and traces 28 are connected to a plurality of contacts 32 that are attached to surface pads 33 located on a bottom surface of the package 10. The contacts 32 may be solder balls that are reflowed onto a printed circuit board 34. By way of example, the printed circuit board 34 may be a motherboard of a computer that contains a power supply(ies) 36 that provides two different voltage levels of power.

In one embodiment, the power bus 24 is connected to one voltage level, such as 3.3 V, and the other power bus 26 can be connected to a second voltage level, such as 2.0 V. In this manner the package provides two different voltage levels to the integrated circuit 12. Although the busses 24 and 26 are described as being both dedicated to power, it is to be understood that one bus may be connected to power and the other bus may be connected to ground. Such a configuration may reduce the capacitance of the package 10. Additionally, although solder balls 32 are shown and described, it is to be understood that the package 10 may have other types of contacts such as pin (not shown) that are soldered to the printed circuit board 34.

The different layers of bond pads 16, contacts 32 and busses 24 and 26, bus 30, and routing traces 28 may all be interconnected by vias 38. The busses 24 and 26 may include clearance spaces 42 that electrically isolate the busses 24 and 26 from the vias 38. Additionally, the busses 24 and 26 are also separated by spaces 43.

Figure 4:
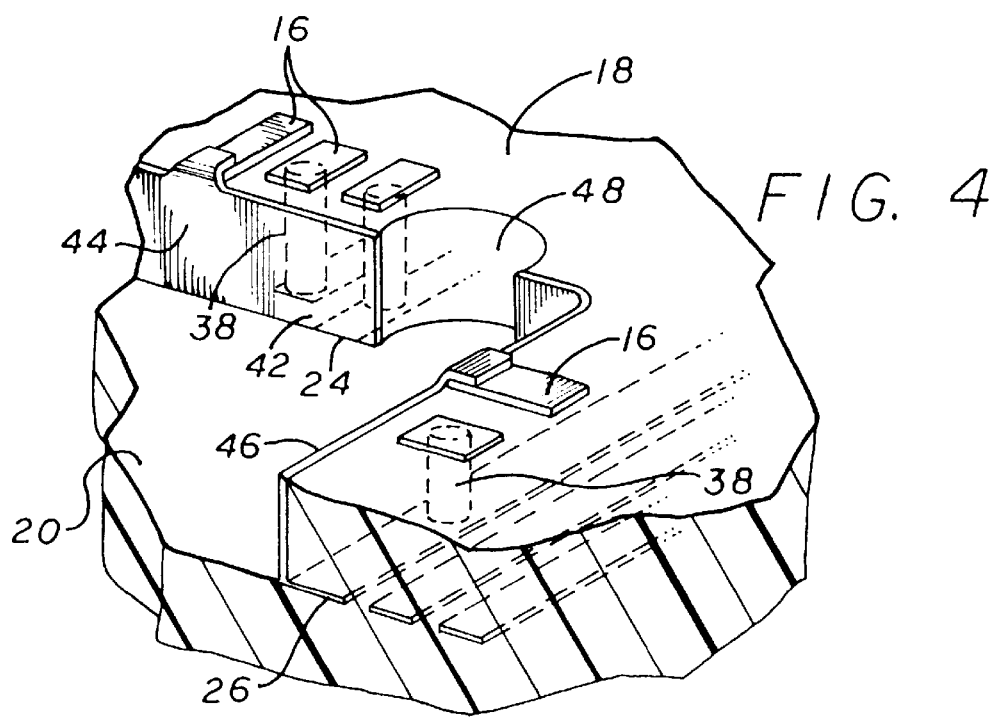
FIG. 4 is an enlarged perspective view of a bond shelf of the package showing a pair of conductive strips that wrap around the edge of a bond shelf to connect a pair of conductive busses to bond pads located on the shelf.

FIG. 4 shows a first conductive strip 44 and a second conductive strip 46 that wrap around an edge of the first bond shelf 18 to connect the bond pads 16 to the power busses 24 and 26. As shown in FIG. 1, the conductive strips 44 and 46 connect to the power busses 24 and 26 at the edge of the first bond shelf 18. The conductive strips 44 and 46 can be separated by a pair of notches 48 formed in the first bond shelf 18. Some of the bond pads 16 are connected to bus 24 by conductive strip 44 while other bond pads 16 are connected to bus 26 by strip 46. The separate strips allow the bond pads 16 on the first shelf 18 to be connected to two different voltage levels. The other bond pads 16 on the first shelf 18 may be interconnected to other layers and/or contacts 34 by vias 38.

In the preferred embodiment, the package 10 is constructed with a laminated printed circuit board process. The ground layer 30 can be formed on a dielectric substrate with conventional photolithographic techniques. A second substrate may be placed on the ground layer 30. The layer may have a plurality of holes used for the formation of the vias 38. The second substrate may contain copper layers that are etched to form the routing traces 28 and bond pads 16. Additional substrates may be added to create the busses 24 and 26, and bond pads 16. The vias 38 can then be formed with a plating process. The substrates are then "autoclaved" to form the package housing 11.

Figure 5:
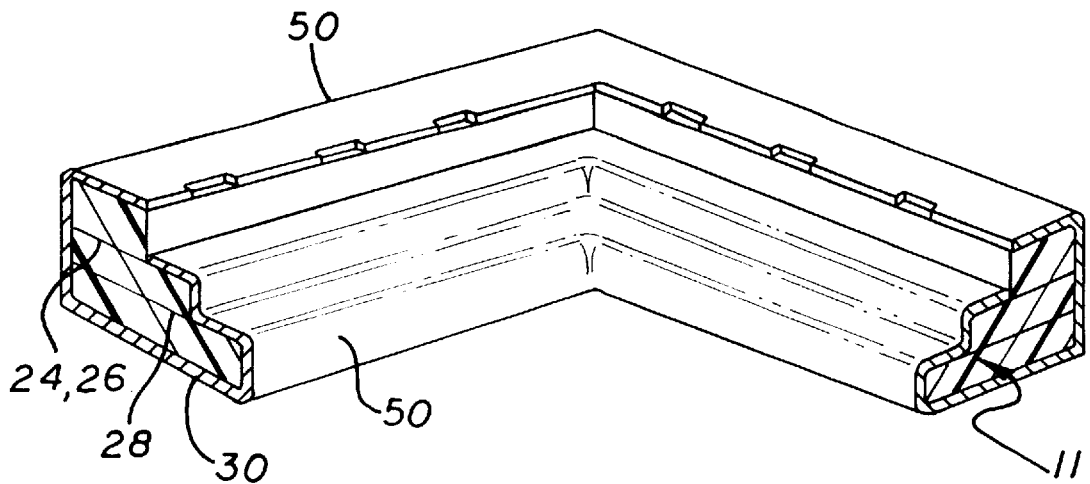
FIG. 5 is a perspective view showing the package masked by a plating resist material.
Figure 6:
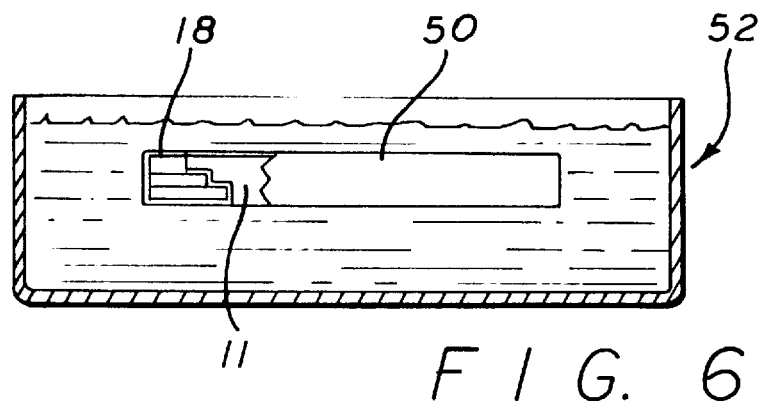
FIG. 6 is a side view showing the package within a plating bath.

The conductive strips 44 and 46 can be formed by initially masking off all surfaces of the package housing, except the edge of the first bond shelf 18 with a plating resist maskant 50, as shown in FIG. 5. The masked housing can then be dipped into a plating bath 52 as shown in FIG. 5. The plating bath 52 plates a conductive material such as copper onto the edge of the first bond shelf 18. The maskant 50 is then removed and the notches 48 can be drilled into the edges of the first bond shelf 18 to separate the plated material into the first and second conductive strips 44 and 46. All exposed copper surfaces may then be plated with gold.

Figure 7:
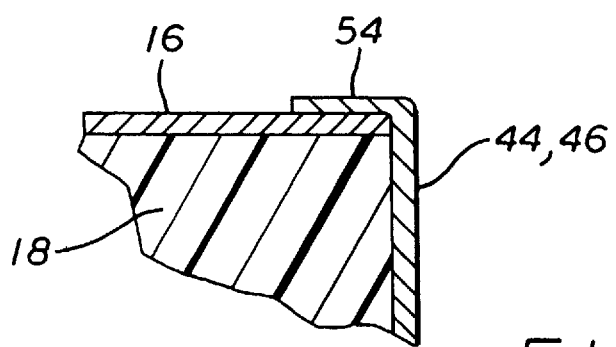
FIG. 7 is an enlarged view of a conductive strip that extends along an edge of a bond shelf.

As shown in FIG. 7, portions 54 of the conductive strips 44 and 46 may extend onto the first bond shelf 18 to connect to a bonding pad 16 after "first bond shelf 18". The extra portions 54 may further anchor the conductive strips 44 and 46 to the housing and reduce the likelihood of delamination during the drilling process. The additional portions 54 can be formed by not masking the end of the first bond shelf 18 so that conductive material plates onto the shelf.

Referring to FIGS. 1 and 2, after the strips 44 and 46 are formed, the integrated circuit 12 may be mounted onto the package and connected to the bond pads 16. The integrated circuit 12 may then be enclosed with an encapsulant 56. The contacts 32 are attached to the surface pads 33 to complete the package 10.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A package for an electronic device, comprising:

a housing including a first bond pad shelf that has an edge;

a first bond pad located on said first bond pad shelf;

a first conductive strip that extends along said edge and onto said first bond pad shelf, the first conductive strip to wrap around said edge of said first bond pad shelf and couple to said first bond pad;

a first conductive bus and a second conductive bus in the same plane underneath said first bond pad shelf, said first conductive bus to have applied a first voltage potential and said second conductive bus to have applied a second voltage potential;

said first conductive bus connected to said first conductive strip to connect said first conductive bus to said first bond pad; and a plurality of pins on a bottom surface of the package, the plurality of pins to couple to a printed circuit board.

2. The package as recited in claim 1, wherein said first and second conductive strips extend onto said first bond shelf.

3. The package as recited in claim 1, wherein said first bond shelf edge includes a notch, the notch to separate said first conductive strip from said second conductive strip.

4. The package as recited in claim 1, further comprising: a third bond pad located on a second bond shelf.

5. The package as recited in claim 1, wherein said first conductive bus is at a first voltage potential and said second conductive bus is at a second voltage potential.

6. The package as recited in claim 1, further comprising: an integrated circuit mounted to said housing and connected to said first and second bond pads.

7. The package as recited in claim 6, wherein the integrated circuit is connected to said first and second bond pads using bond wires.

8. The package as recited in claim 6, wherein the integrated circuit is connected to said first and second bond pads using tape of a tape automated bonding (TAB) system.

9. The package as recited in claim 1, wherein said first and second conductive busses are on the same plane of the package.

10. The package as recited in claim 1, wherein said first conductive strip and said second conductive strip are on the same plane of the package.

11. The package as recited in claim 1, wherein the printed circuit board is a motherboard of a computer.

12. A package for an electronic device, comprising:

a housing including a first bond pad shelf that has an edge;

a first bond pad located on said first bond pad shelf;

a first conductive strip that extends along said edge and onto said first bond pad shelf, the first conductive strip to wrap around said edge of said first bond pad shelf and couple to said first bond pad;

a first conductive bus and a second conductive bus in the same plane underneath said first bond pad shelf, said first conductive bus to have applied a first voltage potential and said second conductive bus to have applied a second voltage potential;

said first conductive bus connected to said first conductive strip to connect said first conductive bus to said first bond pad; and a plurality of pins on a bottom surface of the package, the plurality of pins to couple to a printed circuit board.

13. The package as recited in claim 12, wherein the printed circuit board is a motherboard of a computer.

14. The package as recited in claim 12, further comprising:

a second bond pad located on said first bond shelf, said second conductive bus connected to a second conductive strip to connect said second conductive bus to said second bond pad, said second conductive strip to wrap around said edge of said first bond pad shelf and connect to said second bond pad, said second conductive strip extends along said edge and onto said first bond pad shelf.

15. The package as recited in claim 14, wherein said edge of said first bond pad shelf includes a notch that separates said first conductive strip from said second conductive strip.

16. The package as recited in claim 14, further comprising:

a third bond pad located on a second bond pad shelf.

17. The package as recited in claim 12, further comprising:

an integrated circuit mounted to said housing and connected to said first bond pad.

18. The package as recited in claim 17, wherein the integrated circuit is connected to said first bond pad using a bond wire.

19. The package as recited in claim 17, wherein the integrated circuit is connected to said first bond pad using a tape of a tape automated bonding (TAB) system.

20. A computer system comprising:

a motherboard, the motherboard having an integrated circuit coupled thereto, the integrated circuit including a package and an integrated circuit die mounted thereto, the package including, a housing that has a first bond shelf and an edge of said first bond shelf;

a first bond pad located on said first bond shelf;

a second bond pad located on said first bond shelf a first conductive bus located within said housing;

a first conductive strip coupled to said first conductive bus, the first conductive strip to wrap around said edge of said first bond shelf and couple to said first bond pad to connect said first conductive bus to said first bond pad;

a second conductive bus located within said housing;

a second conductive strip coupled to said second conductive bus, the second conductive strip to wrap around said edge of said first bond shelf and couple to said second bond pad to connect said second conductive bus to said second bond pad; and a plurality of pins on a bottom surface of the package, the plurality of pins to couple to the motherboard.

21. The computer as recited in claim 20, wherein said first and second conductive strips extend onto said first bond shelf.

22. The computer as recited in claim 20, wherein said first bond shelf edge includes a notch, the notch to separate said first conductive strip from said second conductive strip.

23. The computer as recited in claim 20, further comprising a third bond pad located on a second bond shelf.

24. The computer as recited in claim 20, wherein said first conductive bus is at a first voltage potential and said second conductive bus is at a second voltage potential.

25. The computer as recited in claim 20, wherein the integrated circuit die mounted to said housing is connected to said first and second bond pads.

26. A packaged integrated circuit comprising:

an integrated circuit package and an integrated circuit die mounted thereto, the integrated circuit package including, a housing that has a first bond shelf and an edge of said first bond shelf;

a first bond pad located on said first bond shelf;

a second bond pad located on said first bond shelf a first conductive bus located within said housing;

a first conductive strip coupled to said first conductive bus, the first conductive strip to wrap around said edge of said first bond shelf and couple to said first bond pad to connect said first conductive bus to said first bond pad;

a second conductive bus located within said housing;

a second conductive strip coupled to said second conductive bus, the second conductive strip to wrap around said edge of said first bond shelf and couple to said second bond pad to connect said second conductive bus to said second bond pad; and a plurality of pins on a bottom surface of the package, the plurality of pins to couple to the motherboard.

27. The packaged integrated circuit as recited in claim 26, wherein said first and second conductive strips extend onto said first bond shelf.

28. The packaged integrated circuit as recited in claim 26, wherein said first bond shelf edge includes a notch, the notch to separate said first conductive strip from said second conductive strip.

29. The packaged integrated circuit as recited in claim 26, further comprising:

a third bond pad located on a second bond shelf.

30. The packaged integrated circuit as recited in claim 26, wherein said first conductive bus is at a first voltage potential and said second conductive bus is at a second voltage potential.

31. The packaged integrated circuit as recited in claim 26, the integrated circuit die mounted to said housing is connected to said first and second bond pads.

32. An integrated circuit package for housing an integrated circuit, the integrated circuit package comprising:

a first bond shelf with an edge, the first bond shelf having a plurality of bonding pads located thereon;

a first conductive bus and a second conductive bus located in the same plane under the first bond shelf;

a first conductive edging coupled to the first conductive bus at the edge of the first bond shelf, the first conductive edging located adjacent the edge of the first bond shelf, the first conductive edging having a first strip extending over the edge of the first bond shelf and coupled to one of the plurality of bond pads to connect the first conductive bus thereto;

a second conductive edging coupled to the second conductive bus at the edge of the first bond shelf, the second conductive edging located adjacent the edge of the first bond shelf and separated from the first conductive edging, the second conductive edging having a second strip extending over the edge of the first bond shelf and coupled to another one of the plurality of bonding pads to connect the second conductive bus thereto; and a plurality of pins on a bottom surface of the integrated circuit packages, the plurality of pins to couple to a printed circuit board.

33. The integrated circuit package as recited in claim 32, wherein the first conductive edging couples to the first conductive bus by the first conductive bus extending to the edge of the first bond shelf where the first conductive edging is located and the second conductive edging couples to the second conductive bus by the second conductive bus extending to the edge of the first bond shelf where the second conductive edging is located.

34. The integrated circuit package as recited in claim 32, wherein the first strip couples to the one of the plurality of bonding pads by extending over and beyond the edge of the first bond shelf to where the one of the plurality of bonding pads is located and the second strip couples to the another one of the plurality of bonding pads by extending over and beyond the edge of the first bond shelf to where the another one of the plurality of bonding pads is located.

35. The integrated circuit package as recited in claim 32, wherein the first strip couples to the one of the plurality of bonding pads by the one of the plurality of bonding pads extending to the edge of the first bond shelf to the location where the first strip extends over the edge, and the second strip couples to the another one of the plurality of bonding pads by another one of the plurality of bonding pads extending to the edge of the first bond shelf to the location where the second strip extends over the edge.

* * * * *